April 22, 1969 R. M. CAMBRIDGE ETAL 3,440,556
PRCTECTIVE SYSTEM FOR AMPLIFIERS
Filed June 13, 1966
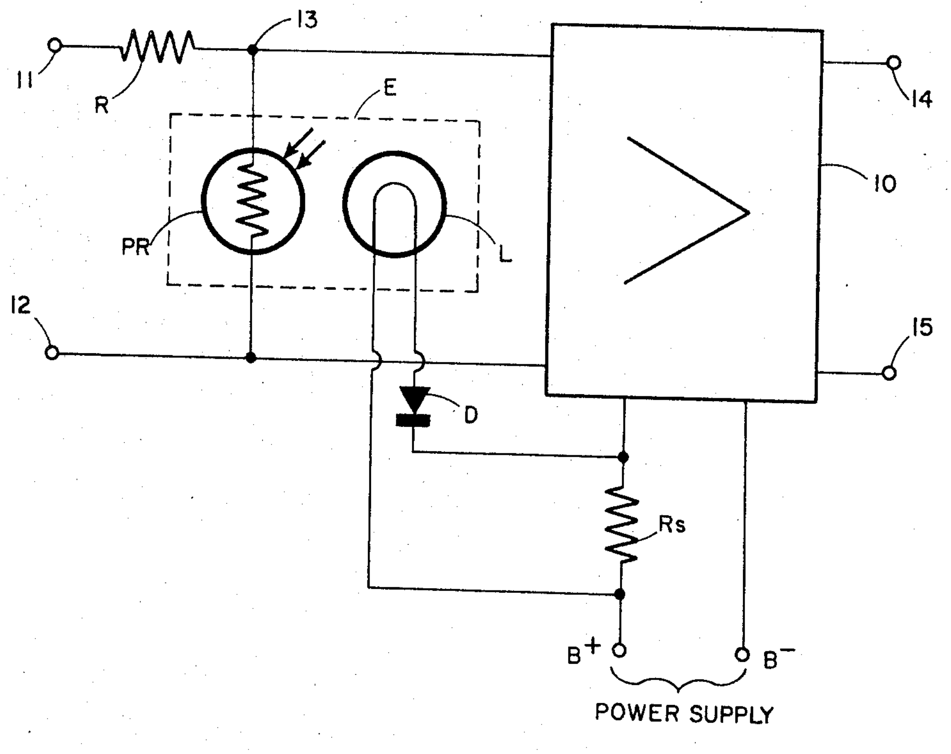
INVENTORS
R.N. CAMBRIDGE
A.K. GARDINER
AGENT
Curphey & Erickson

United States Patent Office 3,440,556

Patented Apr. 22, 1969

3,440,556

PROTECTIVE SYSTEM FOR AMPLIFIERS

Ronon M. Cambridge, Ottawa, Ontario, and Allan K. Gardiner, Belleville, Ontario, Canada, assignors to Northern Electric Company Limited, Montreal, Quebec, Canada Filed June 13, 1966, Ser. No. 557,075

Int. Cl. H03f 1/02, 17/00

U.S. Cl. 330—59 8 Claims

ABSTRACT OF THE DISCLOSURE

A protection system for class B and C transistor amplifiers employing a series resistor in the power supply input to the amplifier, and a diode and a light source in parallel with the resistor. A photo-resistor is connected in shunt across the amplifier input terminals. A power supply current exceeding a predetermined value due to a short circuit in the amplifier output illuminates the light source to lower the resistance of the photo-resistor and by-pass an appropriate portion of the input signal to the amplifier to prevent damage to the amplifier.

This invention relates to an overload protection system for use with amplifiers.

More particularly, this invention relates to a protection system for amplifiers such as class B and class C transistor amplifiers in which an overload current in the output will result in an increased flow of current from the power supply and excessive dissipation in the transistors unless the input signal to the amplifier is lowered or removed.

Many circuits have been designed to protect power transistors in amplifiers against excessive currents resulting from short circuits in the output stage. In most cases, and logically so, attention has been directed mainly to the output stage itself as the place where a fault can be quickly detected to activate suitable circuitry for protecting the transistors against damaging surges of current. However, this has necessitated feedback circuits that are very complex and expensive. These circuits have been designed to give full protection to the transistors by rendering the amplifier completely inoperative even when the output stage is only partially short-circuited.

The present invention overcomes the above disadvantages by providing a simple and inexpensive circuit protection which allows the amplifier to deliver power at a reduced level to partially shorted loads without causing any distortion at the output of the amplifier.

The nature of this invention is based on the fact that, for certain amplifiers such as class B and class C amplifiers, the power supply current is not at a fixed value and that any increase or variation of current appearing in the output circuit of the amplifier and caused by a partial or complete short-circuit is reflected on the current drawn from the power supply. A significant step has been made in the art in realizing that the power supply lead current may be advantageously used as a means for sensing an overload current in the output of these types of amplifiers and in the further realization that this may be used to control the input signal to the amplifier to protect the transistors against excessive currents and still provide undistorted output even under partial short-circuit conditions. The positioning of the sensing means in the power supply lead rather than in the output of the amplifier, as it was normally done in the prior art, does not take up useful output power and does not influence the output impedance of the amplifier.

The present invention provides a protection system which, in its broadest aspect, comprises means connected to the power supply for sensing an increase of output current above a predetermined value and means responsive to the sensing means and connected to the input terminals of the amplifier for controlling the input signal when the output current exceeds this predetermined value.

In a preferred embodiment of the invention, the sensing means is placed in series with the power supply lead and, with a partial or complete short-circuit occurring at the output of the amplifier, causes actuation of a controlling means connected across the input terminals of the amplifier, which will permit a large portion of input signal to by-pass the amplifier.

In order that the invention may readily be understood, a preferred embodiment thereof will be now be described, by way of example, with reference to the accompanying drawing in which the single figure is a schematic diagram of a protective circuit according to the invention adapted for use with an amplifier.

The circuit comprises an amplifier 10 having input terminals 12 and 13 and output terminals 14 and 15. A power supply is connected to the amplifier 10 by means of terminals $B^+$ and $B^-$ which comprises the power input of the amplifier. A sensing means comprising a resistor $R_s$ of low resistance is placed in series with power supply lead connected to terminal $B^+$ to provide a voltage proportional to the power supply current. In parallel with the sensing resistor $R_s$ is the series connection of a diode D and a light source such as lamp L. The lamp is enclosed in a light-proof enclosure E with a controlling means which comprises a photo-resistor PR, or any suitable light sensitive device, connected across terminals 12 and 13. The photo-resistor PR is characterized by having a resistance value which varies inversely with the intensity of light to which it is exposed.

A resistance R connected to a terminal 11 and in series with the input at terminal 13 is required to form one section of a voltage divider. The photo-resistor PR connected between terminals 12 and 13 is used as the other section of the voltage divider, thus the voltage applied to the input terminals 12 and 13 of the amplifier is the ratio of PR divided by the sum of R and PR, multiplied by the input voltage applied to terminals 11 and 12.

Other controlling means may be used in place of the one hereinabove described; for example, a silicon control switch which is activated by the voltage appearing across the sensing means. Basically, any device which exhibits a rapid change of impedance when activated may be used as a controlling means.

The normal operation of the protective system is as follows:

A short-circuit at the output stage of the amplifier results in a larger-than-normal current flow from the power supply into the amplifier. As the supply current increases, a voltage is derived from the sensing resistor $R_s$ in the power supply lead to the amplifier. The diode D will conduct current to the lamp L only when the voltage derived from resistor $R_s$ exceeds the forward potential drop across the diode. When this potential drop is exceeded, light from the lamp L gradually illuminates the photo-resistor PR. Since the value of the resistance of PR decreases when exposed to light, a portion of the incoming input signal will by-pass the amplifier by flowing through the photo-resistor PR.

If the output of the amplifier is completely short-circuited, a heavy current is drawn from the power supply and a relatively large voltage drop appears across resistor $R_s$. This will light lamp L with a sufficiently high intensity to cause a sharp drop in the resistance of photo-resistor PR. With photo-resistor PR exhibiting a low resistance, most of the incoming signal is by-passed so that only an insignificant amount enters the amplifier and the latter is therefore rendered effectively non-operating.

In the event of a partial but potentially damaging short-circuit, the current from the power supply through resistor $R_s$ will increase sufficiently to exceed the forward potential drop of the diode D. Light will be emitted from lamp L but its intensity will be less than under complete short-circuit conditions. In fact it will be in proportion to the degree of short-circuitness. The resistance of the photo-resistor PR and therefore the amount of incoming signal by-passing the amplifier will be proportional to the intensity of lamp L and to the increased current drawn from the power supply. The amplifier will therefore operate at reduced output power and, with the incoming input signal thus partially shunted, will deliver a reduced but undistorted signal to the partially short-circuited load.

The purpose of putting the diode in the protection circuit is to prevent an appreciable current from flowing through the light source until the power supply current has reached a predetermined value. But it will be realized of course that the use of any suitable controlling means which is effective only when a current higher than normal flows through the sensing means would make the diode unnecessary.

What is claimed is:

1. A protective system for an amplifier having input terminals for receiving an input signal, output terminals for connection to a load, and a power input for delivering direct current to the amplifier from a power supply, said amplifier being of the class wherein an increase of current through the load is reflected in an increase of direct current drawn from the power supply, said protective system comprising sensing means connected to the power input of the amplifier for detecting an increase of current from the power supply above a predetermined value, and controlling means connected to the input terminals and responsive to said sensing means for limiting the input signal when said current exceeds said predetermined value.

2. A protective system as defined in claim 1 wherein said system is for use with class B and class C amplifiers.

3. A protective system as defined in claim 2 wherein said sensing means is connected in series with the power supply.

4. A protective system as defined in claim 3 wherein said sensing means comprises a resistor connected in series with the power supply and a light source connected in parallel with said resistor whereby the intensity of light emitted by said light source is proportional to the current flowing through said resistor, and wherein said controlling means comprises a light-sensitive device.

5. A protective system as defined in claim 4 wherein said sensing means further comprises a diode serially connected to said light source, said diode preventing appreciable current from flowing through said light source until the current from the power supply has exceeded said predetermined value.

6. A protective system as defined in claim 5 wherein said controlling means comprises a shunt circuit including said light-sensitive device connected across the input terminals for by-passing a portion of said input signal when said current exceeds said predetermined value.

7. A protective system as defined in claim 6 wherein said light-sensitive device comprises a photo-resistor having a resistance varying inversely with the intensity of light emitted by said light source.

8. A protective system as defined in claim 7 wherein the photo-resistor and the light source are enclosed in a light-proof enclosure thereby preventing light other than that emitted by said light source from falling on the photo-resistor.

References Cited

UNITED STATES PATENTS

| | | | |
|---|---|---|---|
| 3,185,934 | 5/1967 | Patmore et al. | 330—19 |
| 3,248,642 | 4/1966 | Rothschild | 330—59 X |
| 3,332,027 | 7/1967 | Suganuma | 330—13 |

NATHAN KAUFMAN, *Primary Examiner.*

U.S. Cl. X.R.

330—199